((12)) United States Patent
Chen

(10) Patent No.: US 10,026,676 B2
(45) Date of Patent: Jul. 17, 2018

(54) SEMICONDUCTOR LEAD FRAME PACKAGE AND LED PACKAGE

(71) Applicant: ADVANCED SEMICONDUCTOR ENGINEERING, INC., Kaohsiung (TW)

(72) Inventor: Ying-Zhong Chen, New Taipei (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 126 days.

(21) Appl. No.: 13/710,933

(22) Filed: Dec. 11, 2012

(65) Prior Publication Data

US 2014/0159098 A1    Jun. 12, 2014

(51) Int. Cl.
| | |
|---|---|
| H01L 33/36 | (2010.01) |
| H01L 23/495 | (2006.01) |
| H01L 21/56 | (2006.01) |
| H01L 33/62 | (2010.01) |
| H01L 23/24 | (2006.01) |
| H01L 33/64 | (2010.01) |
| H01L 33/48 | (2010.01) |
| H01L 23/498 | (2006.01) |

(52) U.S. Cl.
CPC ............ *H01L 23/495* (2013.01); *H01L 21/56* (2013.01); *H01L 23/24* (2013.01); *H01L 33/62* (2013.01); *H01L 23/49861* (2013.01); *H01L 33/486* (2013.01); *H01L 33/64* (2013.01); *H01L 2224/48091* (2013.01); *H01L 2224/48137* (2013.01); *H01L 2924/3011* (2013.01)

(58) Field of Classification Search
CPC ....... H01L 33/62; H01L 21/56; H01L 33/486; H01L 2224/48137; H01L 2224/48091; H01L 23/495; H01L 23/24; H01L 2924/3011; H01L 23/49861; H01L 33/64
See application file for complete search history.

(56) References Cited

U.S. PATENT DOCUMENTS 5,172,214 A * 12/1992 Casto ........................... 257/676
5,912,592 A * 6/1999 Kikushima ..................... 331/68
(Continued)

FOREIGN PATENT DOCUMENTS

| CN | 101142692 | 3/2008 |
|---|---|---|
| CN | 202601725 | 12/2012 |

(Continued)

OTHER PUBLICATIONS

Office Action on corresponding foreign application (TW 103119422) from the Taiwan Intellectual Property Office dated Jan. 27, 2016.

(Continued)

*Primary Examiner* — Cuong B Nguyen
(74) *Attorney, Agent, or Firm* — Klein, O'Neill & Singh, LLP

(57) ABSTRACT

The present invention relates to a semiconductor lead frame package and LED package. The semiconductor lead frame package includes a die pad, a lead, a die and an insulator body. The lead is electrically isolated from the die pad. The die is disposed on the die pad and electrically connected to the lead. The insulator body partially encapsulates the die pad and the lead, and has a top surface and a bottom surface, wherein a part of the lead is folded onto the top surface of the insulator body.

17 Claims, 11 Drawing Sheets

(56) References Cited

U.S. PATENT DOCUMENTS

| | | | | |
|---|---|---|---|---|
| 6,060,772 | A * | 5/2000 | Sugawara | H01L 25/162 257/678 |
| 6,486,543 | B1 * | 11/2002 | Sano et al. | 257/684 |
| 6,700,194 | B2 * | 3/2004 | Nakajima | H01L 21/565 257/701 |
| 6,730,544 | B1 * | 5/2004 | Yang | H01L 23/3107 257/678 |
| 2008/0073759 | A1 * | 3/2008 | Youn | H01L 23/3107 257/666 |
| 2008/0157321 | A1 * | 7/2008 | Camacho et al. | 257/686 |
| 2011/0133320 | A1 * | 6/2011 | Inokuchi et al. | 257/675 |
| 2011/0156085 | A1 * | 6/2011 | Lin et al. | 257/99 |
| 2012/0061810 | A1 | 3/2012 | Chien et al. | |

FOREIGN PATENT DOCUMENTS

| | | |
|---|---|---|
| KR | 20100134330 | 12/2010 |
| KR | 20110066795 | 6/2011 |
| KR | 20130009059 | 1/2013 |
| KR | 20130029628 | 3/2013 |
| TW | M384415 U1 | 7/2010 |
| TW | M442581 U1 | 12/2012 |

OTHER PUBLICATIONS

Office Action on corresponding foreign application (CN 201410244514.1) from the PRC State Intellectual Property Office dated Jun. 8, 2017.

* cited by examiner

SEMICONDUCTOR LEAD FRAME PACKAGE AND LED PACKAGE

BACKGROUND OF THE INVENTION

Field of the Invention

The present invention relates to semiconductor packages, and more particularly, to semiconductor lead frame packages and LED packages.

Description of the Related Art

Light-emitting diode (LED) devices are preferred for many lighting applications due to the advantages they provide, such as low cost, low energy consumption, and related environmental benefits. A typical LED device includes at least one LED package containing a LED chip. LED device efficiency depends on not only LED chip quantum efficiency but also package design.

A LED device generates heat during use that must be dissipated. Heat not only causes inefficiencies, but also influences long-term reliability of LED devices. Consequently, LED devices typically include a metal heat sink for better heat dissipation.

Some LED packages include a pre-molded lead frame, instead of a conventional ceramic substrate, to carry the LED chip. The pre-molded lead frame includes a pre-molded insulator encapsulating a lead frame having multiple electrodes and a thermal pad. The electrodes and thermal pad are exposed on a bottom of the LED package.

However, conventional LED packages cannot be directly surface-mounted to the electrically conductive surface of the metal heat sink, because the heat sink would short circuit the LED package's exposed electrodes. Typically, a printed circuit board provides an electrically insulative buffer between the conventional LED package and the heat sink to overcome this problem, but that solution significantly increases manufacturing costs.

In addition, to reduce the thermal impedance between the LED package and the heat sink, the circuit board is often provided with thermal vias or metal inserts that extend through the circuit board. These features only further increase manufacturing costs.

Another LED package design, called a chip-on-board (COB) package, includes LED chips mounted on a metal-core printed circuit board (MCPCB). The MCPCB typically includes an aluminum plate with an insulating layer coated on its front surface and a copper pattern on the insulating layer that provides electrical routing and connection.

The COB LED package can be directly surface-mounted to the electrically conductive surface of the metal heat sink. However, the heat transmission from the LED chip to the heat sink is significantly hindered by the insulating layer between the copper pattern and the aluminum core, which results in low thermal dissipation efficiency.

SUMMARY OF THE INVENTION

In accordance with one embodiment, a semiconductor lead frame package includes a die pad, a lead, a die disposed on a top surface of the die pad and electrically connected to a main portion of the lead disposed above the die pad. An insulator body partially encapsulates the die pad and the lead, an electrode portion of the lead being folded onto a top surface of the insulator body, the electrode portion being parallel to the main portion, wherein a bottom surface of the die pad is exposed from a bottom surface of the insulator body.

In one embodiment, the exposed bottom surface of the die pad directly contacts a heat sink. That is, the bottom surface of the die pad is thermally attached to the heat sink. Thus, the heat generated by the die can be dissipated to the air rapidly through the die pad and the heat sink, which results in high heat dissipating efficiency.

In one embodiment, the lead includes the main portion, a connecting portion folded from the main portion, and the electrode portion folded from the connecting portion on to the top surface of the insulator body. The connecting portion of the lead is folded into a notch of the insulator body such that the connecting portion is recessed from a lateral surface of the insulator body. By recessing the connecting portion from the lateral surface of the insulator body, the chances of short circuiting occurring between the lead and the heat sink is significantly reduced.

BRIEF DESCRIPTION OF THE DRAWINGS

Common reference numerals are used throughout the drawings and the detailed description to indicate the same elements. The present invention will be more apparent from the following detailed description taken in conjunction with the accompanying drawings.

DETAILED DESCRIPTION OF THE INVENTION

Figure 1:
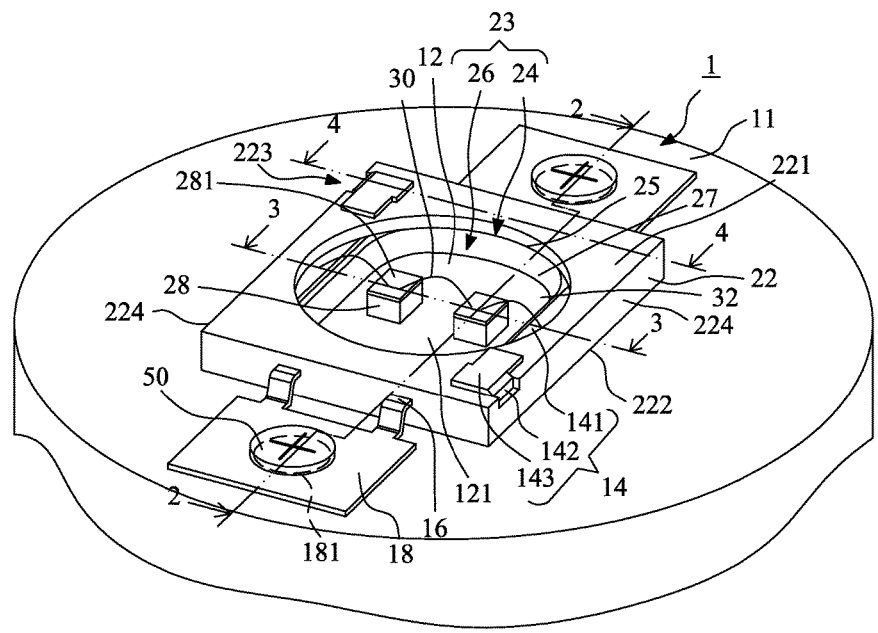
FIG. 1 illustrates a perspective view of a semiconductor lead frame package mounted to a heat sink according to one embodiment.

Referring to FIG. 1, a semiconductor lead frame package 1 according to one embodiment is illustrated. The semiconductor lead frame package 1 includes a die pad 12, at least one lead 14, e.g., two leads 14, at least one rib 16, e.g., four ribs 16, at least one fixing element 18, e.g., two fixing elements 18, an insulator body 22, at least one bonding wire 30, e.g., three bonding wires 30, at least one die 28, e.g., two dies 28, at least one light converting layer 281, e.g., two light converting layers 281, and an encapsulant 32.

The die pad 12 is used for carrying the die 28. In this embodiment, the die 28 is a light-emitting diode (LED) die, and is adhered to the die pad 12. Thus, the semiconductor lead frame package 1 is a LED package. The material of the die pad 12 is metal such as copper.

Although two dies 28 are illustrated in the figures, in another embodiment, the semiconductor lead frame package 1 includes only a single die 28. In yet another embodiment, the semiconductor lead frame package 1 includes more than two dies 28.

The insulator body 22 (also referred to as housing) partially encapsulates the die pad 12 and the lead 14 thereby forming a premolded lead frame, and has a top surface 221, a bottom surface 222, at least one notch 223, e.g., two notches 223, and a central opening 23. The notch 223 is disposed on an edge of the insulator body 22. More particularly, lateral surfaces 224 of insulator body 22 extend perpendicularly between the top surface 221 and bottom surface 222 of the insulator body 22 and the notches 223 are formed within the lateral surfaces 224.

An upper inner sidewall 25 of the insulator body 22 defines an upper central opening 24 in the insulator body 22. A lower inner sidewall 27 of the insulator body 22 defines a lower central opening 26 of the insulator body 22. The central opening 23 includes the lower central opening 26 and the upper central opening 24.

The upper central opening 24 is communicated with the lower central opening 26, and the size of the upper central opening 24 is greater than that of the lower central opening 26. The lower central opening 26 exposes a part of the die pad 12 on which the die 28 is disposed, and the upper central opening 24 exposes a part of the lead 14 on which the bonding wire 30 is bonded. The material of the insulator body 22 may be a molding compound, such as, for example, a transparent or translucent polymer, a soft gel, an elastomer, a resin, an epoxy resin, a silicone, or an epoxy-silicone hybrid resin.

The two leads 14 are electrically isolated from the die pad 12, and each of the leads 14 has a main portion 141, a connecting portion 142 and an electrode portion 143, e.g. as a positive electrode and a negative electrode. The main portion 141 is embedded in the insulator body 22, and a part of the main portion 141 is exposed from the upper central opening 24 of the insulator body 22 and electrically connected to the die 28 through the bonding wire 30. The connecting portion 142 connects the main portion 141 and the electrode portion 143, and is disposed in the notch 223.

Figure 4:
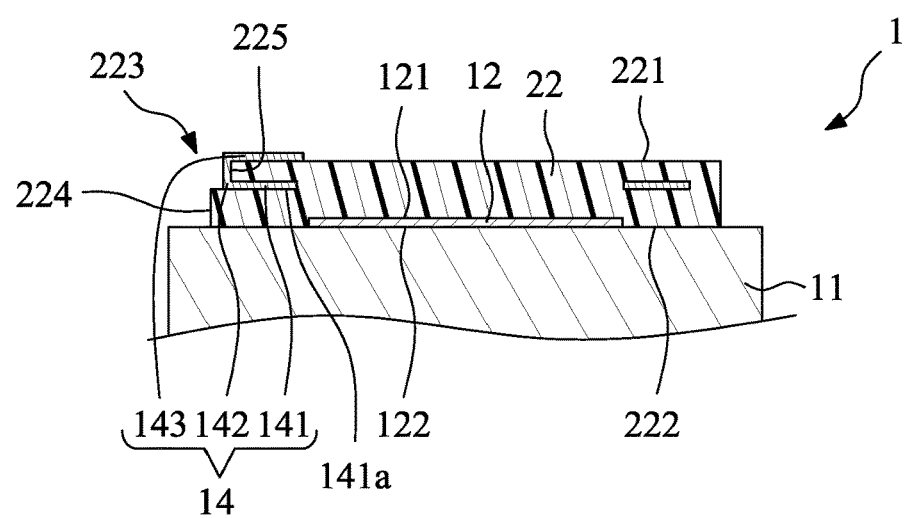
FIG. 4 illustrates a cross-sectional view taken along line 4-4 of FIG. 1.

In this embodiment, the connecting portion 142 extends out of the insulator body 22 and is disposed on a sidewall 225 of the notch 223 (see FIG. 4). The connecting portion 142 is folded so that the connecting portion 142 is substantially perpendicular to the main portion 141. Although various features may be described as being perpendicular, parallel, or having other relations, in light of this disclosure, those of skill in the art will understand that the features may not be exactly perpendicular or parallel, but only substantially perpendicular or parallel to within accepted manufacturing tolerances.

The electrode portion 143 is disposed on the top surface 221 of the insulator body 22, and is used for external electrical connection. The electrode portion 143 is folded so that the electrode portion 143 is substantially perpendicular to the connecting portion 142, and the electrode portion 143 is substantially parallel to the main portion 141. In this embodiment, the material of the lead 14 (the main portion 141, the connecting portion 142, and the electrode portion 143) is metal such as copper. The leads 14 and the die pad 12 may be referred to as a lead frame.

The encapsulant 32 is disposed in the central opening 23, i.e., the lower central opening 26 and the upper central opening 24, to encapsulate the die 28 and the bonding wire 30. The encapsulant 32 may be made of a transparent polymer or a translucent polymer, for example, a soft gel, an elastomer, a resin, an epoxy resin, a silicone, or an epoxy-silicone hybrid resin.

To improve the uniformity of light-emitting from the die 28, the light may be scattered as it is emitted. Thus, scattering particles may be added into the encapsulant 32 to randomly refract light as it passes through the encapsulant 32.

In this embodiment, a top surface 33 of the encapsulant 32 is coplanar with the top surface 221 of the insulator body 22; however, in other embodiments, the top surface 33 of the encapsulant 32 may bulge to form a convex lens structure.

The light converting layer 281 is disposed between the encapsulant 32 and the die 28. The light converting layer 281 substantially covers the top surface of the die 28, and may also cover a portion of each bonding wire 30.

The light converting layer 281 includes particles of a light converting substance, such as, for example, fluorescent particles. Light, for example, blue light, emitted from the die 28 may be converted by the light converting substance into light of different colors, such as, for example, green, yellow, and red, and the different colors may then be mixed to generate white light.

However, in other embodiments, the light converting layer 281 may be omitted for a monochromatic LED package. Alternatively, the light converting layer 281 may be replaced by a light converting substance in the encapsulant 32.

A part of the rib 16 and the fixing element 18 are exposed from the insulator body 22. The fixing element 18 is connected to the die pad 12 through the rib 16. In this embodiment, the fixing element 18 is a plate and has a through hole 181 for external connecting. The material of the rib 16 and the fixing element 18 is metal such as copper.

Figure 2:
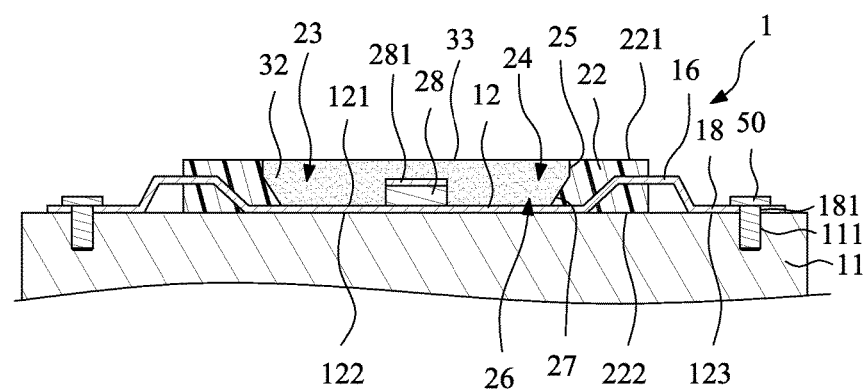
FIG. 2 illustrates a cross-sectional view taken along line 2-2 of FIG. 1.

Referring to FIG. 2, a cross-sectional view taken along line 2-2 of FIG. 1 is illustrated, wherein the semiconductor lead frame package 1 is further mounted to an external heat sink 11 to form a LED module. The die pad 12 has a top surface 121 and a bottom surface 122. The die 28 is disposed on the top surface 121 of the die pad 12. The bottom surface 122 of the die pad 12 is coplanar with the bottom surface 222 of the insulator body 22 so as to be exposed from the bottom surface 222 of the insulator body 22 and contact the heat sink 11 directly. That is, the bottom surface 122 of the die pad 12 is thermally attached to the heat sink 11.

Thus, the heat generated by the die 28 can be dissipated to the air rapidly through the die pad 12 and the heat sink 11, which results in high heat dissipating efficiency. Furthermore, the die pad 12, the rib 16 and the fixing element 18 are the same plate formed by punching so that the rib 16 is bent and a bottom surface 123 of the fixing element 18 is coplanar with the bottom surface 122 of the die pad 12. The fixing element 18 is used to be secured to the heat sink 11.

In this embodiment, a fastener 50 is received within the through hole 181 of the fixing element 18 and the opening 111 of the heat sink 11 to secure the semiconductor lead frame package 1 to the heat sink 11. The fastener 50 and the opening 111 of the heat sink 11 may be threaded. However, it is understood that the fixing element 18 may be adhered or soldered to the heat sink 11. In addition, the bottom surface 123 of the fixing element 18 is coplanar with the bottom surface 122 of the die pad 12 so that when the fixing element 18 is secured to the heat sink 11, the bottom surface 122 of the die pad 12 contacts the heat sink 11 at the same time.

Figure 3:
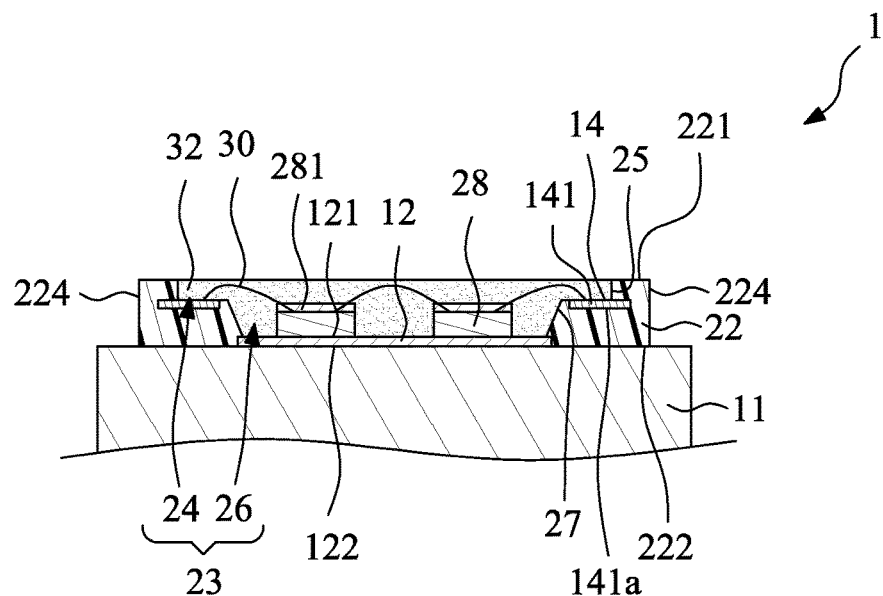
FIG. 3 illustrates a cross-sectional view taken along line 3-3 of FIG. 1.

Referring to FIG. 3, a cross-sectional view taken along line 3-3 of FIG. 1 is illustrated, wherein the semiconductor lead frame package 1 is further mounted to the heat sink 11. The horizontal of the main portion 141 of the lead 14 is higher than that of the die pad 12, i.e., the plane within which the main portion 141 of the lead 14 lies is above the plane within which the die pad 12 lies. That is, the main portion 141 of the lead 14 is disposed above and spaced apart from the die pad 12.

In the present embodiment, bottom surfaces 141a of the main portion 141 of the leads 14 are covered by the insulator body 22 such that the semiconductor lead frame package 1 can be mounted directly to the metal heat sink 11 without short circuiting the leads 14.

The portion of the insulator body 22 between the main portion 141 of the lead 14 and the die pad 12 defines the lower central opening 26, and the portion of the insulator body 22 on the main portion 141 of the lead 14 defines the upper central opening 24. More particularly, the lower inner sidewall 27 of the insulator body 22 extends between the main portion 141 of the lead 14 and the die pad 12 and defines the lower central opening 26. The upper inner sidewall 25 of the insulator body 22 extends between the main portion 141 of the lead 14 and the top surface 221 of the insulator body 22 and defines the upper central opening 24.

Figure 4A:
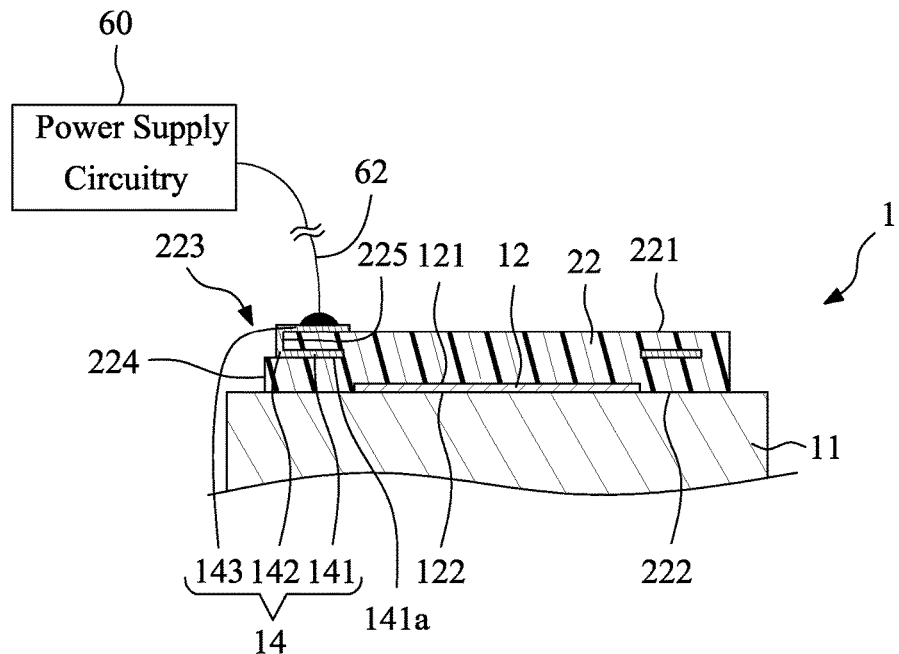
FIG. 4A illustrates a cross-sectional view of the semiconductor lead frame package of FIG. 4 connected to an external power supply circuitry by an electric wire.

Referring to FIG. 4, a cross-sectional view taken along line 4-4 of FIG. 1 is illustrated. Referring to FIG. 4A, the semiconductor lead frame package 1 of FIG. 4 is connected to an external power supply circuitry 60 by a pair of contacts or electric wires 62 (only one is shown in FIG. 4A) which are secured to the exposed electrode portions 143 of the leads 14. The external power supply circuitry 60 delivers current to the semiconductor lead frame package 1 so that the LED die 28 may generate light.

In this embodiment, the lead 14 (the main portion 141, the connecting portion 142 and the electrode portion 143) is formed integrally, and is folded twice to form the main portion 141, the connecting portion 142 and the electrode portion 143 respectively. A part, i.e., the connecting portion 142, of the lead 14 is folded onto the sidewall 225 of the notch 223 such that the connecting portion 142 is recessed from the lateral surface 224 of the insulator body 22, and another part, i.e., the electrode portion 143, of the lead 14 is further folded onto the top surface 221 of the insulator body 22.

The position of the notch 223 corresponds to the folded part, i.e., the connecting portion 142 and the electrode portion 143, of the lead 14. In certain embodiments, the connecting portion 142 is recessed from the lateral surface 224 of the insulator body 22 by at least 0.15 mm, thereby significantly reducing the chances of short circuiting occurring between the leads 14 and the heat sink 11, as further discussed below.

In one embodiment, the semiconductor lead frame package 1 does not have the notch 223, and the connecting portion 142 is disposed on the lateral surface 224, which shortens the distance between the leads 14 and the heat sink 11, and may result in an increased possibility of short circuiting occurring between the leads 14 and the heat sink 11. In addition, in the illustrated embodiment, when viewed from the bottom surface 222 of the insulator body 22, the bottom surface 122 of the die pad 12 is exposed but the bottom surfaces 141a of the main portions 141 of the leads 14 are not exposed.

Figure 5:
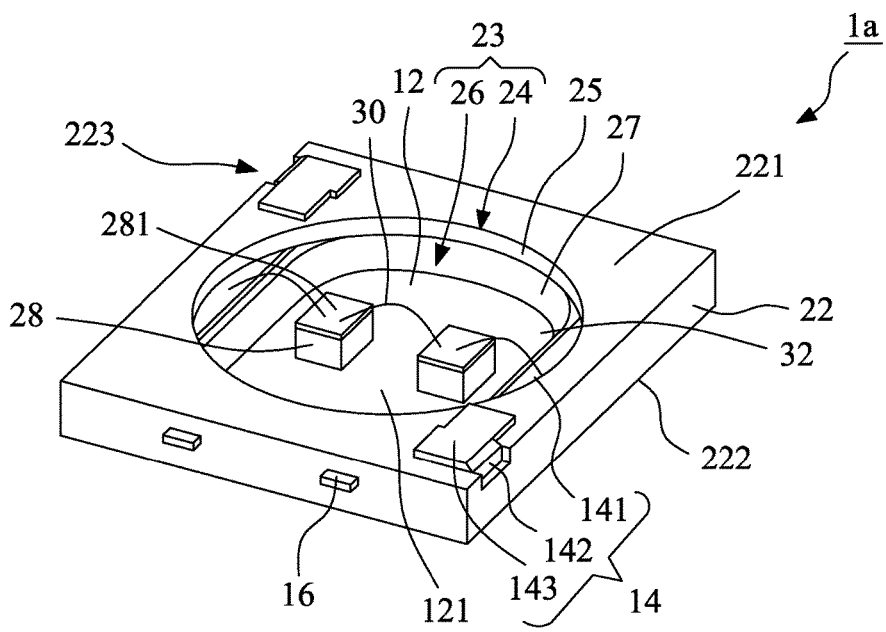
FIG. 5 illustrates a perspective view of a semiconductor lead frame package according to another embodiment.

Referring to FIG. 5, a semiconductor lead frame package 1a according to another embodiment is illustrated. The semiconductor lead frame package 1a is substantially similar to the semiconductor lead frame package 1 of FIG. 1, and the same elements are designated with same reference numerals. The difference between the semiconductor lead frame package 1a of this embodiment and the semiconductor lead frame package 1 of FIG. 1 is that the semiconductor lead frame package 1a does not have the fixing element 18 of the semiconductor lead frame package 1. Thus, only a part of the rib 16 is exposed from the side of the insulator body 22.

Figure 6:
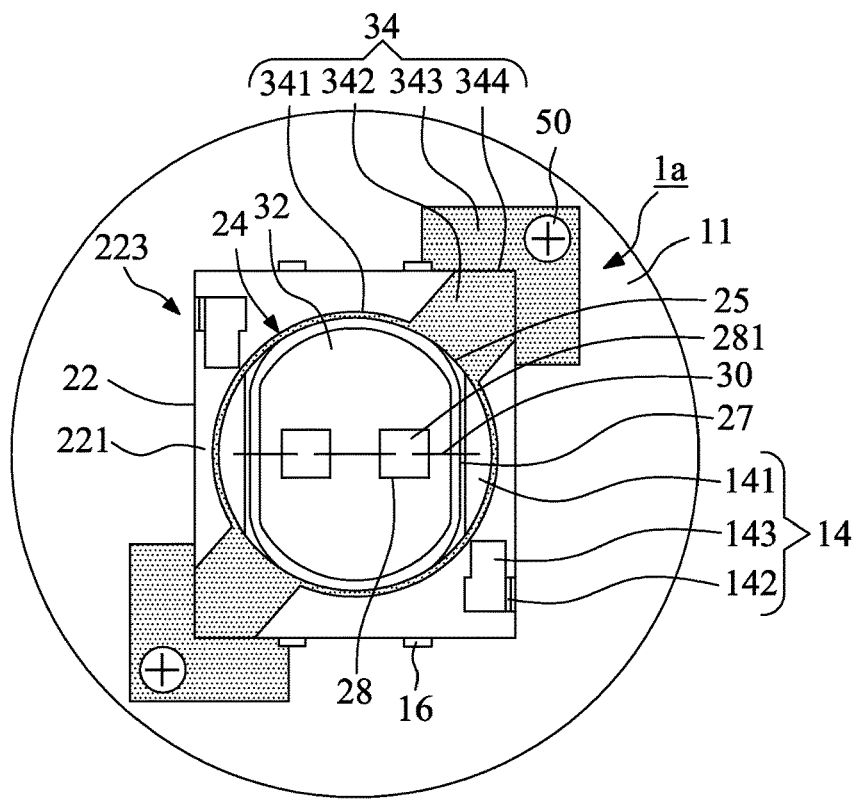
FIG. 6 illustrates a top view of the semiconductor lead frame package of FIG. 5 mounted to an external heat sink via a connector.

Referring to FIG. 6, a top view of FIG. 5 is illustrated, wherein the semiconductor lead frame package 1a is further mounted to the external heat sink 11 via a connector 34 (the hatched area in FIG. 6). The connector 34 comprises a central ring 341, two top ribs 342, two bottom seats 343, and two vertical portions 344. The central ring 341 is disposed on the top surface 221 of the insulator body 22, and corresponds to the upper central opening 24 of the insulator body 22. The inner diameter of the central ring 341 is slightly greater than the diameter of the upper central opening 24.

The top ribs 342 extend from the central ring 341 to two corners of the insulator body 22, and connect the bottom seats 343 through two vertical portions 344 respectively. The bottom surface of the bottom seats 343 is coplanar with the bottom surface 122 of the die pad 12, and the shape of each of the bottom seats 343 fits the corner of the insulator body 22 so as to lock the insulator body 22. The fastener 50 is used to secure the semiconductor lead frame package 1a to the heat sink 11 through the through hole (not shown) of the bottom seat 343.

Referring to FIGS. 7 to 18, a semiconductor process for manufacturing a semiconductor lead frame package according to an embodiment is illustrated.

Figure 7:
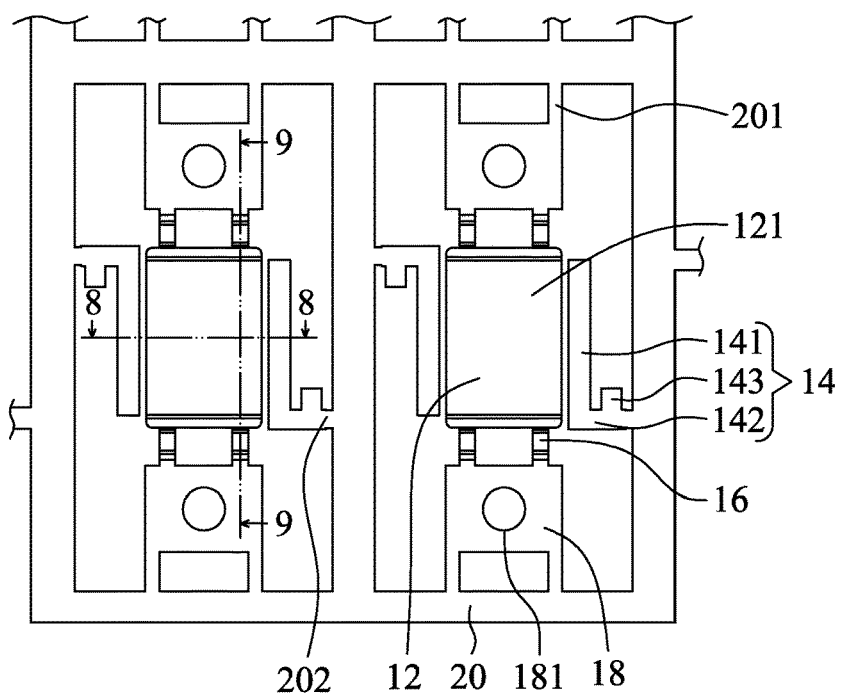
FIGS. 7, 8, 9, 10, 11, 12, 13, 14, 15, 16, 17, 18 illustrate a process for manufacturing a semiconductor lead frame package according to one embodiment.

Referring to FIG. 7, a lead frame is provided. The lead frame includes a plurality of strip portions 20 across each other to define a plurality of units. Each of the units includes a die pad 12, at least one lead 14, at least one rib 16, at least one fixing element 18, at least one first bar portion 201 and at least one second bar portion 202. The pattern of the lead frame may be formed by punching or etching a copper plate.

In this embodiment, each of the units includes two leads 14, four ribs 16 and two fixing elements 18. In this embodiment, each of the fixing elements 18 is a plate and has a through hole 181 for external connecting. The ribs 16 connect the fixing elements 18 and the die pad 12, and the fixing elements 18 are connected to the strip portions 20 by the first bar portions 201. The leads 14 extend along the die pad 12, and do not connect the die pad 12. Each of the leads 14 has a main portion 141, a connecting portion 142 and an electrode portion 143. The connecting portion 142 connects the main portion 141 and the electrode portion 143. The electrode portion 143 is connected to the strip portion 20 by the second bar portion 202.

Figure 8:
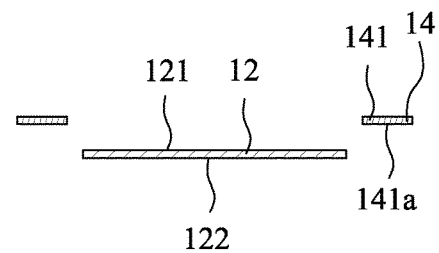

Referring to FIG. 8, a cross-sectional view taken along line 8-8 of FIG. 7 is illustrated. The die pad 12 has a top surface 121 and a bottom surface 122. The main portion 141 has a bottom surface 141a. The horizontal of the main portion 141 of the lead 14 is higher than that of the die pad 12. That is, the main portion 141 of the lead 14 is disposed above and spaced apart from the die pad 12.

Figure 9:
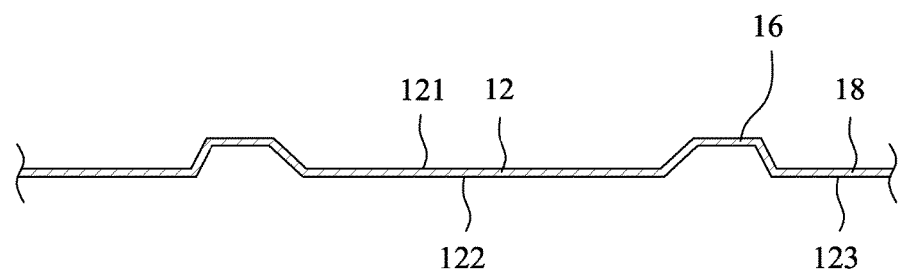

Referring to FIG. 9, a cross-sectional view taken along line 9-9 of FIG. 7 is illustrated. In this embodiment, the die pad 12, the rib 16 and the fixing element 18 are the same plate formed by punching so that the rib 16 is bent and the bottom surface 123 of the fixing element 18 is coplanar with the bottom surface 122 of the die pad 12. Therefore, when the fixing element 18 is secured to the heat sink 11 (FIG. 2), the bottom surface 122 of the die pad 12 contacts the heat sink 11 at the same time.

Figure 10:
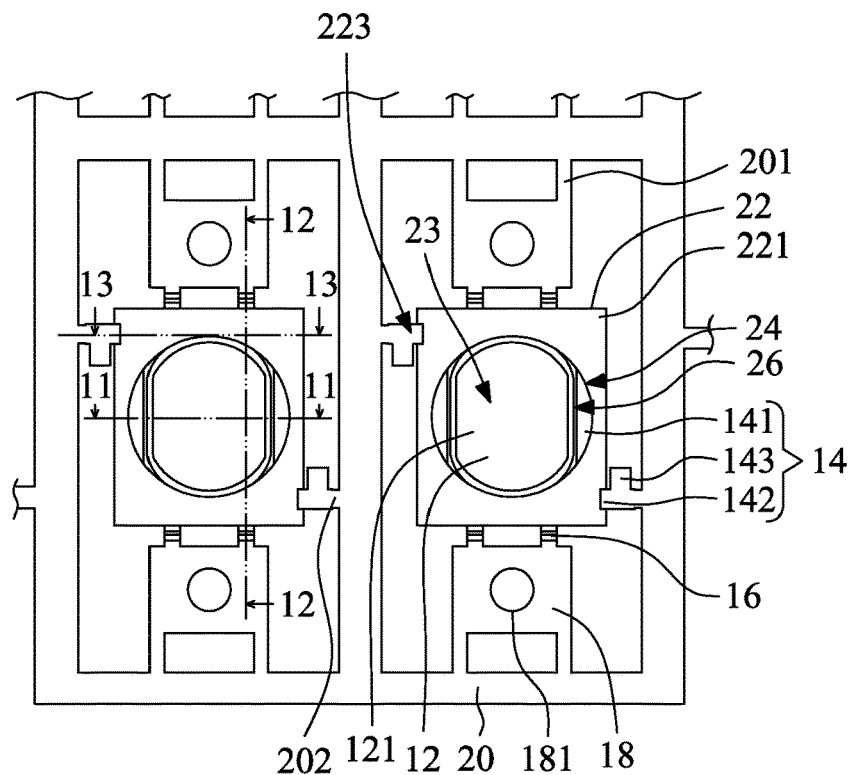

Referring to FIG. 10, the insulator body 22 is formed to partially encapsulate the die pad 12 and the lead 14, and has at least one notch 223 and a central opening 23. The notch 223 is disposed on an edge of the insulator body 22. The central opening 23 includes a lower central opening 26 and an upper central opening 24. The upper central opening 24 is communicated with the lower central opening 26, and the size of the upper central opening 24 is greater than that of the lower central opening 26. The lower central opening 26 exposes a part of the die pad 12 on which the die 28 is disposed, and the upper central opening 24 exposes a part of the main portion 141 of the lead 14 on which the bonding wire 30 is bonded. The material of the insulator body 22 may be a molding compound, such as, for example, a transparent or translucent polymer, a soft gel, an elastomer, a resin, an epoxy resin, a silicone, or an epoxy-silicone hybrid resin.

Figure 11:
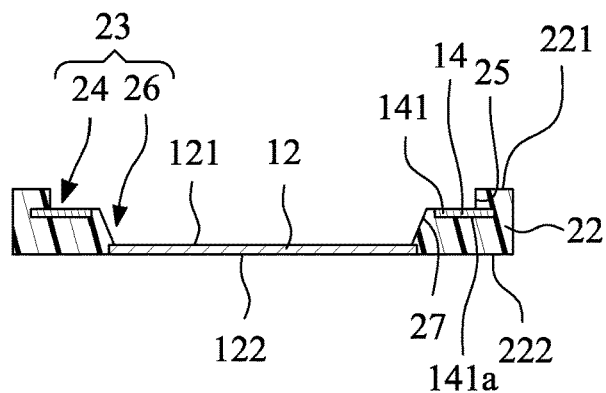

Referring to FIG. 11, a cross-sectional view taken along line 11-11 of FIG. 10 is illustrated. The insulator body 22 further has a top surface 221, a bottom surface 222, at least one notch 223 and a central opening 23. The portion of the insulator body 22 between the main portion 141 of the lead 14 and the die pad 12 defines the lower central opening 26, and the portion of the insulator body 22 on the main portion 141 of the lead 14 defines the upper central opening 24.

Figure 12:
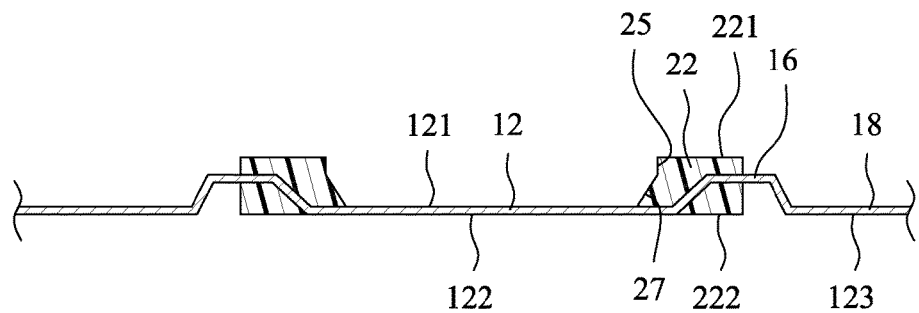

Referring to FIG. 12, a cross-sectional view taken along line 12-12 of FIG. 10 is illustrated. The bottom surface 122 of the die pad 12 is coplanar with the bottom surface 222 of the insulator body 22 so as to be exposed from the bottom surface 222 of the insulator body 22. A part of the rib 16 and the fixing element 18 are exposed from the insulator body 22.

Figure 13:
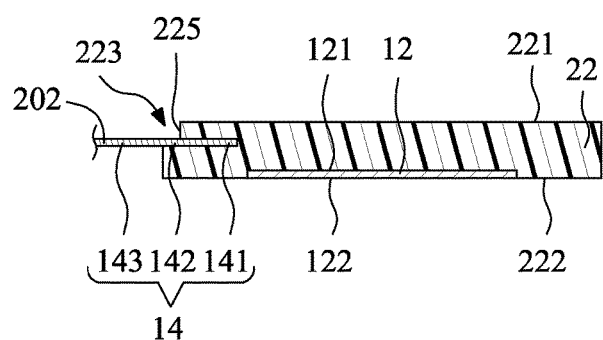

Referring to FIG. 13, a cross-sectional view taken along line 13-13 of FIG. 10 is illustrated. The position of the notch 223 corresponds to the connecting portion 142 and the electrode portion 143 of the lead 14. Thus, the connecting portion 142 and the electrode portion 143 extend out of the insulator body 22 through the notch 223.

Figure 14:
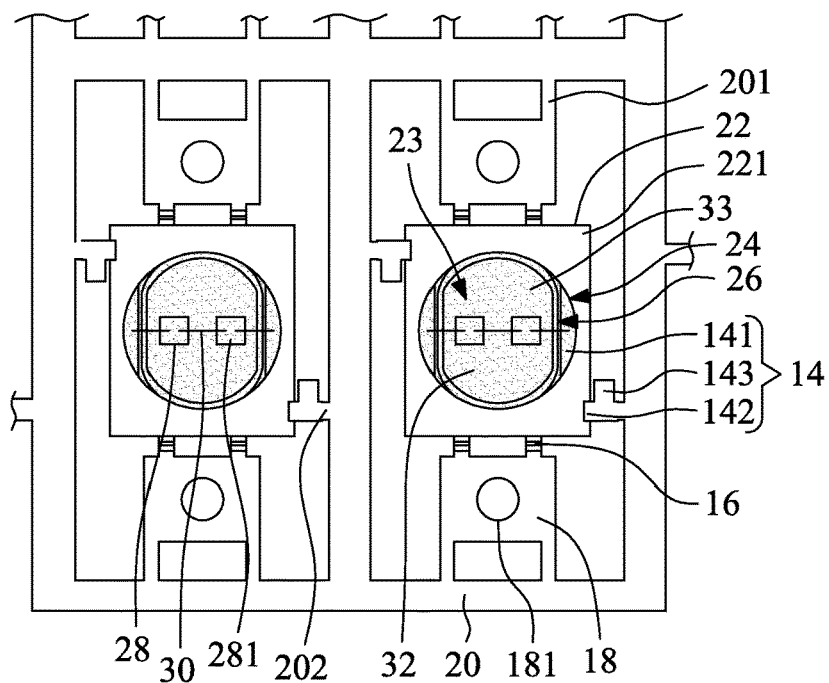

Referring to FIG. 14, the die 28 is attached to the top surface 121 of the die pad 12. In this embodiment, the die 28 is a light-emitting diode (LED) die, and is adhered to the die pad 12. Then, at least one bonding wire 30 is bonded from the die 28 to the exposed part of the main portion 141 of the lead 14. Then, the light converting layer 281 is applied to cover the top surface of the die 28 and may also cover a portion of each bonding wire 30.

The light converting layer 281 includes particles of a light converting substance, such as, for example, fluorescent particles. Light, for example, blue light, emitted from the die 28 may be converted by the light converting substance into light of different colors, such as, for example, green, yellow, and red, and the different colors may then be mixed to generate white light. However, in other embodiments, the light converting layer 281 may be omitted for a monochromatic LED package.

Then, the encapsulant 32 is applied in the central opening 23, i.e., the lower central opening 26 and the upper central opening 24, to encapsulate the die 28 and the bonding wire 30. The encapsulant 32 may be made of a transparent polymer or a translucent polymer, for example, a soft gel, an elastomer, a resin, an epoxy resin, a silicone, or an epoxy-silicone hybrid resin.

To improve the uniformity of light-emitting from the die 28, the light may be scattered as it is emitted. Thus, scattering particles may be added into the encapsulant 32 to randomly refract light as it passes through the encapsulant 32. In this embodiment, the top surface 33 of the encapsulant 32 is coplanar with the top surface 221 of the insulator body 22; however, in other embodiments, the top surface of the encapsulant 32 may bulge to form a convex lens structure.

Figure 15:
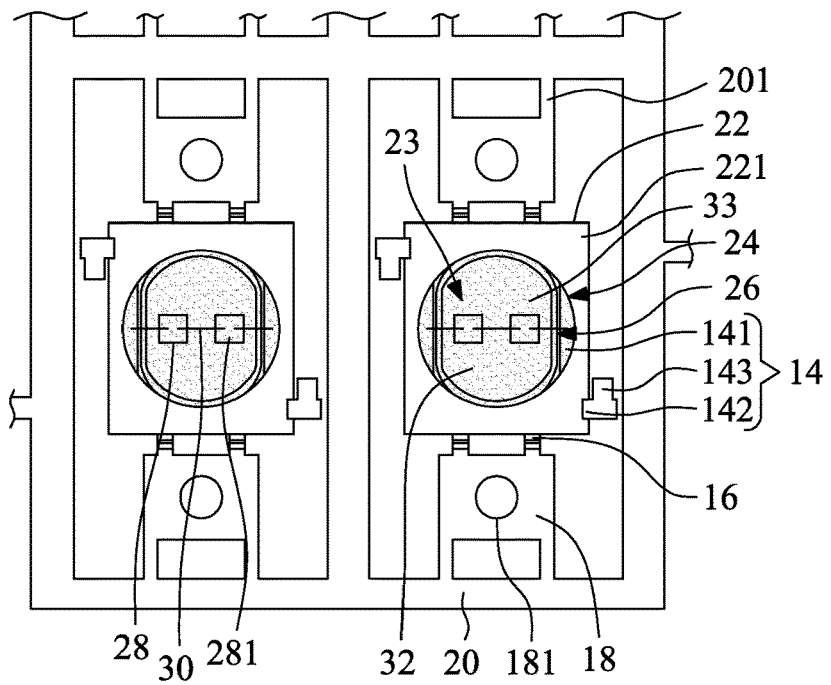

Referring to FIGS. 14 and 15 together, the second bar portions 202 are cut off.

Figure 16:
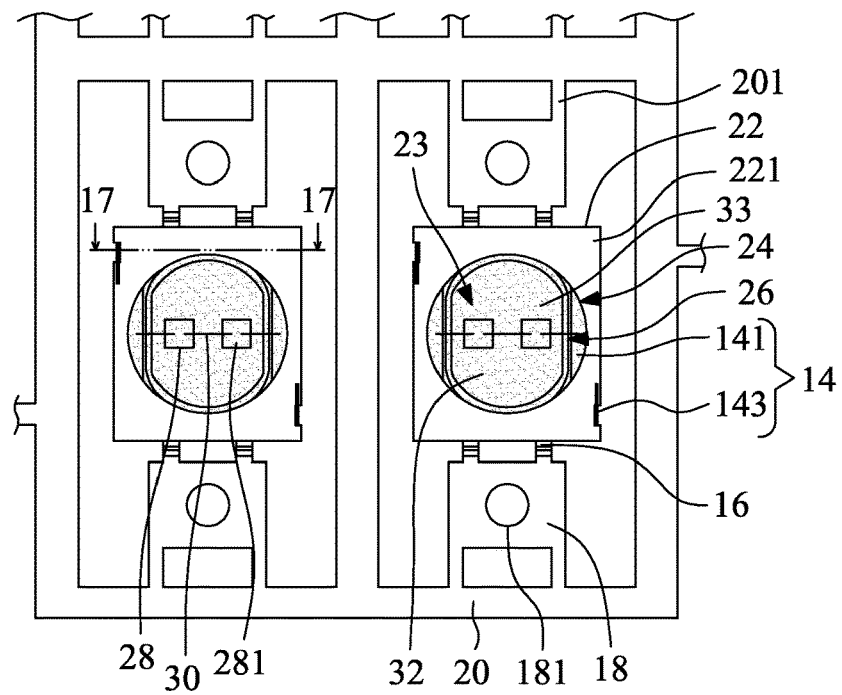

Referring to FIG. 16, the connecting portions 142 of the leads 14 are folded upwardly.

Figure 17:
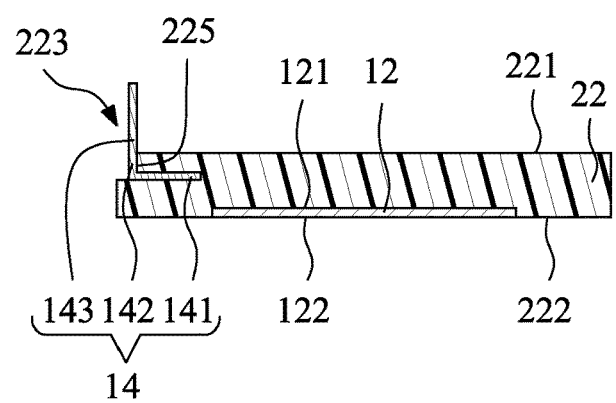

Referring to FIG. 17, a cross-sectional view taken along line 17-17 of FIG. 16 is illustrated. In this embodiment, the connecting portion 142 is folded on the sidewall 225 of the notch 223, and is substantially perpendicular to the main portion 141. Meanwhile, the electrode portion 143 of the lead 14 protrudes from the top surface 221 of the insulator body 22.

Figure 18:
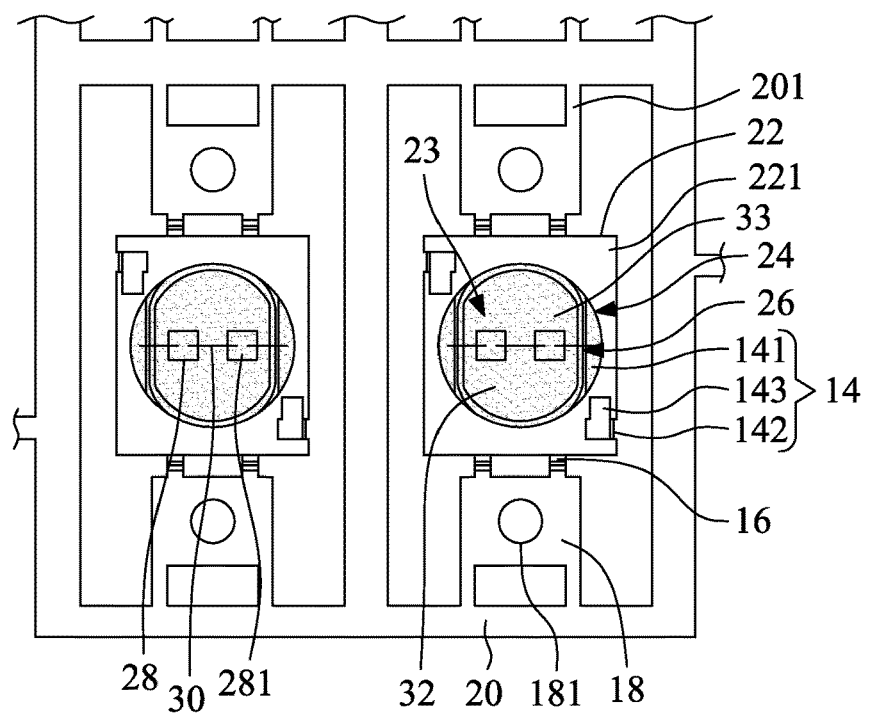

Referring to FIG. 18, the electrode portion 143 of the leads 14 are folded onto the top surface 221 of the insulator body 22, so that the electrode portion 143 is substantially perpendicular to the connecting portion 142, and the electrode portion 143 is substantially parallel to the main portion 141. The electrode portions 143 are used for external electrical connection. Then, the first bar portions 201 are cut off so as to obtain the semiconductor lead frame package 1 of FIG. 1.

Figure 19:
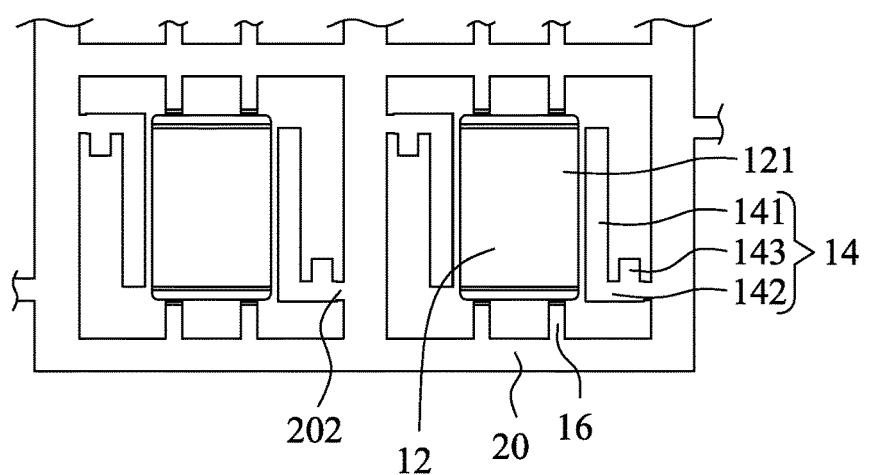
FIGS. 19 to 20 illustrate a process for manufacturing a semiconductor lead frame package according to another embodiment.
Figure 20:
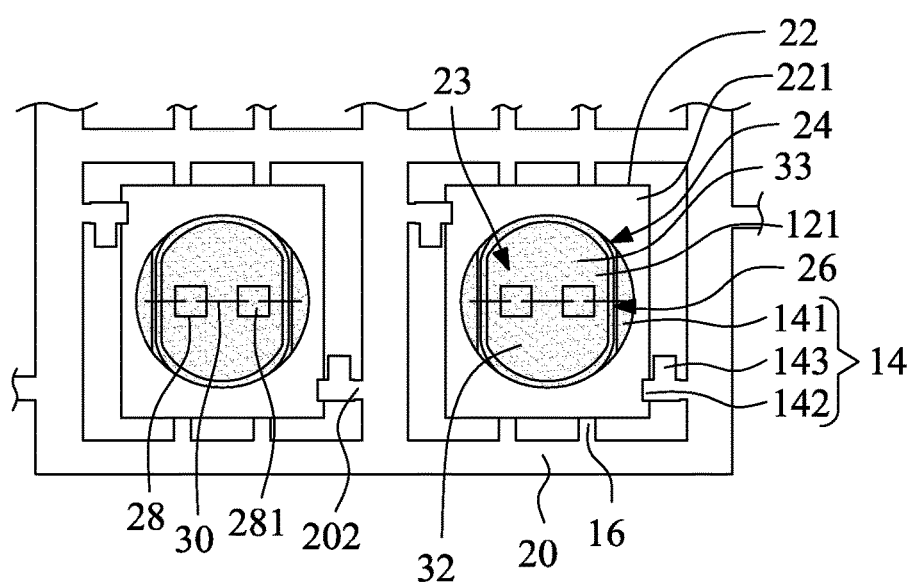

Referring to FIGS. 19 to 20, a semiconductor process for manufacturing a semiconductor lead frame package according to another embodiment is illustrated.

Referring to FIG. 19, a lead frame is provided. The lead frame of this embodiment is substantially similar to the lead frame of FIG. 7, and the same elements are designated with same reference numerals. The difference between the lead frame of this embodiment and the lead frame of FIG. 7 is that the lead frame of this embodiment does not have the fixing element 18 of the lead frame of FIG. 7, and the ribs 16 connect the strip portions 20 directly. Therefore, in the same size of lead frame, the design of this embodiment has more units, which increases packaging density.

Referring to FIG. 20, the insulator body 22 is formed to partially encapsulate the die pad 12 and the lead 14 as FIG. 10. Then, the die 28 is attached to the top surface 121 of the die pad 12, the bonding wire 30 is bonded from the die 28 to the exposed part of the main portion 141 of the lead 14, the light converting layer 281 is applied to cover the top surface of the die 28 and may also cover a portion of each bonding wire 30, as FIGS. 10 and 14.

The subsequent steps of this embodiment are the same as the steps of FIGS. 15-18, so as to obtain the semiconductor lead frame package 1a of FIG. 5.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not be necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A structure comprising:
   a die pad;
   a lead comprising a main portion, an electrode portion, and a connecting portion connecting the main portion and the electrode portion;
   a die disposed on a top surface of the die pad and electrically connected to the main portion of the lead disposed above the die pad; and
   an insulator body partially encapsulating the die pad and the lead, the insulator body comprising:
   a top surface;
   a bottom surface; and
   a lateral surface extending between the top surface and the bottom surface,
   wherein, the electrode portion of the lead is folded onto a top surface of the insulator body, the connecting portion of the lead is disposed on the lateral surface of the insulator body, and a bottom surface of the die pad is exposed from the bottom surface of the insulator body;
   wherein the electrode portion is folded upward onto the top surface of the insulator body that is opposite to the bottom surface of the die pad.

2. The structure of claim 1, wherein the bottom surface of the die pad is coplanar with the bottom surface of the insulator body.

3. The structure of claim 1, wherein a plane within which the main portion of the lead lies is spaced apart from a plane within which the die pad lies.

4. The structure of claim 1, wherein a bottom surface of the main portion of the lead is covered by the insulator body.

5. The structure of claim 1 further comprising a heat sink, the bottom surface of the die pad directly contacting the heat sink.

6. The structure of claim 5 further comprising a fixing element connected to the die pad and secured to the heat sink, wherein the bottom surface of the insulator body, the bottom surface of the die pad, and a bottom surface of the fixing element are coplanar and directly contact the heat sink.

7. The structure of claim 1 wherein the connecting portion is perpendicular to the main portion and the electrode portion.

8. The structure of claim 1 wherein the insulator body comprises a lower inner sidewall extending between the main portion of the lead and the die pad, the lower inner sidewall defining a lower central opening exposing the die pad.

9. The structure of claim 8 wherein the insulator body comprises an upper inner sidewall extending between the top surface of the insulator body and the main portion of the lead, the upper inner sidewall defining an upper central opening exposing the main portion of the lead.

10. The structure of claim 1 wherein the insulator body further comprises an upper central opening exposing the main portion of the lead and a lower central opening exposing the die pad, the upper central opening and the lower central opening defining a central opening of the insulator body, the structure further comprising: an encapsulant disposed in the central opening.

11. The structure of claim 10 wherein a top surface of the encapsulant is coplanar with the top surface of the insulator body.

12. A structure comprising:
    a die pad;
    a lead comprising:
      a main portion;
      a connecting portion; and
      an electrode portion;
    a die disposed on the die pad and electrically connected to the main portion of lead; and
    an insulator body partially encapsulating the die pad and the main portion of the lead, the insulator body comprising:
    a top surface having the electrode portion disposed thereon;
    a bottom surface; and
    a lateral surface extending between the top surface and the bottom surface, the lateral surface comprising a notch, wherein the connecting portion of the lead is disposed on the lateral surface of the insulator body and the insulator body comprises an upper central opening exposing the main portion of the lead.

13. The structure of claim 12 wherein the connecting portion is recessed from the lateral surface.

14. The structure of claim 12 wherein the notch comprises a sidewall, the connection portion being disposed on the sidewall.

15. The structure of claim 12 wherein the connecting portion is perpendicular to the main portion and the electrode portion, and the main portion is parallel to the electrode portion.

16. The structure of claim 12 wherein the insulator body further comprises a lower central opening exposing the die pad.

17. The structure of claim 16 wherein the die is a light-emitting diode (LED) die, the structure further comprising an encapsulant in the lower central opening and encapsulating the LED die.

* * * * *